United States Patent
Choi et al.

(10) Patent No.: US 9,070,824 B2
(45) Date of Patent: Jun. 30, 2015

(54) HETEROGENEOUS LAMINATE INCLUDING GRAPHENE, AND THERMOELECTRIC MATERIAL, THERMOELECTRIC MODULE, AND THERMOELECTRIC APPARATUS INCLUDING THE HETEROGENEOUS LAMINATE

(71) Applicant: Samsung Electronics Co., Ltd., Gyeonggi-do (KR)

(72) Inventors: Jae-young Choi, Suwon-si (KR); Seung-hyun Baik, Seoul (KR); Seung-hyun Hong, Seoul (KR); Won-young Kim, Seoul (KR); Eun-sung Kim, Seoul (KR); Young-hee Lee, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 243 days.

(21) Appl. No.: 13/729,820

(22) Filed: Dec. 28, 2012

(65) Prior Publication Data
US 2013/0167897 A1    Jul. 4, 2013

(30) Foreign Application Priority Data
Dec. 30, 2011    (KR) .......................... 10-2011-0147414

(51) Int. Cl.
| H01L 35/22 | (2006.01) |
| H01L 35/16 | (2006.01) |
| H01L 35/32 | (2006.01) |
| H01L 35/34 | (2006.01) |
| H01L 35/18 | (2006.01) |

(52) U.S. Cl.
CPC ................ *H01L 35/22* (2013.01); *H01L 35/16* (2013.01); *H01L 35/18* (2013.01); *H01L 35/34* (2013.01); *H01L 35/32* (2013.01)

(58) Field of Classification Search
CPC ..... Y10S 977/742; H01L 35/32; H01L 35/22; H01L 35/16; H01L 35/34; H01L 35/18
USPC .......................................................... 136/239
See application file for complete search history.

(56) References Cited

U.S. PATENT DOCUMENTS

| 2008/0185030 A1 | 8/2008 | Pierce et al. |
| 2011/0042687 A1* | 2/2011 | Chu et al. ........................ 257/77 |
| 2011/0155478 A1 | 6/2011 | Choi et al. |
| 2011/0240083 A1* | 10/2011 | Rhyee et al. .................. 136/238 |

FOREIGN PATENT DOCUMENTS

| JP | 2010-192780 A | 9/2010 |
| KR | 1020100046633 A | 5/2010 |
| WO | WO 2010115776 A1 * | 10/2010 |

OTHER PUBLICATIONS

Zhang et al., "Binding Graphene Sheets Together Using Silicon: Graphene/Silicon Superlattice", Nanoscale Res Lettt, Vo. 5, (2010), pp. 805-808.*

(Continued)

*Primary Examiner* — Jeffrey T Barton
*Assistant Examiner* — Tae-Sik Kang
(74) *Attorney, Agent, or Firm* — Cantor Colburn LLP (57) ABSTRACT

A heterogeneous laminate including: graphene; and a thermoelectric inorganic compound disposed on the graphene.

28 Claims, 6 Drawing Sheets

(56) References Cited

OTHER PUBLICATIONS

Smith et al., "Theory of semiconductor superlattice electronic structure", vol. 62, No. 1, (1990), pp. 173-234.*

Grubbs et al., "Nucleation and growth during the atomic layer deposition of W on Al2O3 and Al2O3 on W", Thin Solid Films, vol. 467, (2004), pp. 16-27.*

Xi Chen et al.,"Molecular Beam Epitaxial Growth of Topological Insulators", Advanced Materials, vol. 23, 2011, pp. 1162-1165.

Hu Hao et al., "Thermoelectric-transport in metal/graphene/metal hetero-structure", Chin. Phys. B., vol. 19, No. 3, 2010, pp. 037202-1-037202-6.

Kun Chang et al., "In situ synthesis of MoS2/graphene nanosheet composites with extraordinarily high electrochemical performance for lithium ion batteries", Chem. Commun., vol. 47, 2011, pp. 4252-4254.

T. Ouyang et al., "Thermal transport of isotopic-superlattice graphene nanoribbbons with zigzag edge",Europhysics Letters, vol. 88, Oct. 2009, pp. 28002-p1-28002-p5.

International Search Report for International Application No. PCT/KR2012/011775 dated Apr. 19, 2013.

Jung-Hwan Song et al., "Interfacial Dirac Cones from Alternating Topological Invariant Superlattice Structures of Bi2Se3", Physical Review Letters, vol. 105, Aug. 27, 2010, pp. 096403-1-096403-4.

M. G. Kanatzidis et al., "New and Old concepts in Thermoelectric Materials", Angew. Chem. Int. Ed., vol. 48, 2009, pp. 8616-8639.

Mercouri G. Kanatzidis, "Nanostructured Thermoelectrics: the New Paradigm?", Chem. Mater., vol. 22, 2010, pp. 648-659.

Xiao et al., "Enhanced Thermopower of Graphene Films with Oxygen Plasma Treatment", ACS NANO, vol. 5, No. 4, 2011, pp. 2749-2755.

* cited by examiner

HETEROGENEOUS LAMINATE INCLUDING GRAPHENE, AND THERMOELECTRIC MATERIAL, THERMOELECTRIC MODULE, AND THERMOELECTRIC APPARATUS INCLUDING THE HETEROGENEOUS LAMINATE

This application claims priority to and the benefit of Korean Patent Application No. 10-2011-0147414, filed on Dec. 30, 2011, and all the benefits accruing therefrom under 35 U.S.C. §119, the content of which is incorporated herein in its entirety by reference.

BACKGROUND

1. Field

The present disclosure relates to a heterogeneous laminate including graphene, and a thermoelectric material, a thermoelectric module, and a thermoelectric apparatus including the heterogeneous laminate. In particular, the present disclosure relates to thermoelectric materials which provide improved thermoelectric conversion efficiency.

2. Description of the Related Art

The thermoelectric phenomenon refers to a reversible, direct energy conversion between heat and electricity which occurs when electrons and holes move in a material in response to a temperature gradient. The thermoelectric phenomenon includes the Peltier effect and the Seebeck effect. The Peltier effect is used in a cooling system and is based on a temperature difference provided at opposite ends of a material in response to an applied electrical current, and the Seebeck effect is used in a power generation system to provide an electromotive force based on a temperature difference between opposite ends of a material.

A thermoelectric material may be applied to provide a passive cooling system in a semiconductor apparatus to address heat-related problems, and as an active cooling system in an electronic device. Also, the use of thermoelectric materials is increasing in cooling applications as an alternative to conventional refrigerant gas compression. Thermoelectric cooling is an environmentally friendly, vibration-free, and low-noise cooling technology that does not use a refrigerant. Thus use of a conventional refrigerant, which can cause environmental problems, can be avoided. Accordingly, there remains a need for a more efficient thermoelectric material to provide increased thermoelectric cooling efficiency to expand the application range of thermoelectric materials to include residential or commercial cooling systems, such as a refrigerator or an air conditioner.

Also, there remains a need for an improved thermoelectric power generation material, which could be used in a heat dissipating portion of an automobile engine or an industrial factory. Accordingly, there is a need for a thermoelectric power generation material to provide an improved regeneration energy source.

SUMMARY

According to an aspect, a heterogeneous material includes graphene; and a thermoelectric inorganic compound disposed on the graphene.

According to another aspect, a thermoelectric module includes: a first electrode; a second electrode; and a thermoelectric element interposed between the first electrode and the second electrode, wherein the thermoelectric element includes a heterogeneous laminate including graphene and a thermoelectric inorganic compound disposed on the graphene.

Also disclosed is a thermoelectric apparatus including: a heat source; and a thermoelectric module including a first electrode a second electrode; and a thermoelectric element interposed between the first and second electrodes, wherein the thermoelectric element includes a heterogeneous laminate including graphene and a thermoelectric inorganic compound disposed on the graphene.

According to another aspect, a method of manufacturing a thermoelectric material includes: disposing graphene on a substrate; and disposing a thermoelectric inorganic compound on the graphene to manufacture the heterogeneous laminate.

Also disclosed is a method of manufacturing a thermoelectric module, the method including: interposing a thermoelectric element between a first electrode and a second electrode to manufacture the thermoelectric module, the thermoelectric element including a heterogeneous laminate including graphene and a thermoelectric inorganic compound disposed on the graphene.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Expressions such as "at least one selected from," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A plurality of graphene layers is often referred to in the art as graphite. However, for convenience, "graphene" as used herein, may comprise one or more layers of graphene. Thus graphene, as used herein, may have a multiply layered structure comprising single layers of graphene.

A "transition metal" as used herein is an element of Groups 3-12 of the Periodic Table of the Elements.

A thermoelectric material according to an embodiment includes a heterogeneous laminate comprising a thermoelectric inorganic compound and graphene.

Graphene has high conductivity and mobility. While not wanting to be bound by theory, it is understood that because of the high conductivity and mobility of graphene, when graphene is used to form a laminate together with a thermoelectric inorganic compound, improved thermoelectric properties may be provided due to the excellent electrical properties of graphene.

The performance of a thermoelectric material may be evaluated using a dimensionless thermoelectric figure of merit ZT defined by Equation 1:

$$ZT=(S^2 \sigma T)/k \qquad \text{Equation 1}$$

wherein ZT is a figure of merit, S is a Seebeck coefficient, $\sigma$ is an electrical conductivity, T is an absolute temperature, and k is a thermal conductivity.

As illustrated in Equation 1, to increase the ZT of the thermoelectric material, a large Seebeck effect and a high electrical conductivity, that is, a large power factor ($S^2\sigma$), and a low thermal conductivity would be desirable.

Graphene has a two-dimensional planar structure having a honeycomb shape in which carbon atoms are connected to each other in a hexagonal configuration. Graphene has excellent electrical properties due to its high charge mobility. Regarding the thermoelectric characteristics of graphene, in an out-of-plane direction (i.e., in a direction perpendicular to the planar-structure of the graphene), the movement of phonons is blocked due to their scattering. Thus the thermal conductivity characteristics of graphene in the out-of-plane direction may be less than in an in-plane direction (i.e., within the planar structure of the graphene). Accordingly, when such in-plane or out-of-plane characteristics of graphene are applied to provide a thermoelectric material, high electrical conductivity and low thermal conductivity may be simultaneously provided. Thus, the thermoelectric performance of a thermoelectric material, e.g., a thermoelectric element comprising a heterogeneous laminate comprising graphene and the thermoelectric inorganic compound, may be better than the thermoelectric performance of the thermoelectric inorganic compound alone.

A thermoelectric material may include a thermoelectric inorganic compound and graphene. The thermoelectric material may be in the form of a heterogeneous laminate, and may be formed by disposing, e.g., forming, for example, a film of the thermoelectric inorganic compound on graphene, which has a planar structure. The laminate may have a multi-layer structure comprising alternating layers of the graphene and the thermoelectric inorganic compound. The laminate may be formed by alternately stacking the graphene and the thermoelectric material. An embodiment of the multi-layered heterogeneous laminate is disclosed in FIG. 1A. The laminate of FIG. 1A comprises graphene 1 and a thermoelectric inorganic compound 2 that are alternately stacked three times, for example. In an embodiment, the graphene 1 and the thermoelectric inorganic compound 2 may be alternately stacked any suitable number of times, e.g., one or 2 to about 100 times. In an embodiment, the laminate comprises about 4 to about 90, specifically about 8 to about 80 layers of the graphene, and independently about 4 to about 90, specifically about 8 to about 80 layers of the thermoelectric inorganic compound.

The graphene used in the heterogeneous laminate of the thermoelectric material is a polycyclic aromatic molecule formed by covalently bonding a plurality of carbon atoms, wherein the covalently bonded carbon atoms may form a 6-membered ring as a repeating unit. Also, the graphene may further include a 5-membered ring and/or a 7-membered ring. Accordingly, the graphene may be a single layer of covalently bonded carbon atoms (each having $sp^2$ hybridization). As noted above, the graphene may be a single layer or comprise multiple layers of carbon. For example, the graphene may have 1 layer to about 300 layers, specifically about 2 to about 100 layers, more specifically about 3 to about 50 layers of carbon. In the case of a multi-layered graphene, and while not wanting to be bound by theory, it is understood that phonons are scattered at interlayer interfaces. Thus, improved thermoelectric performance may be obtained in the out-of-plane direction.

Also, if the graphene is a multi-layered structure, the graphene may have various stack structures. For example, the stack structure may have an AB-stacking structure or a random-stacking structure. The random-stacking structure may be advantageous compared to the AB-stacking structure in terms of blocking of phonons in the out-of-plane direction, carrier mobility, and electrical conductivity.

The graphene may be prepared by various production methods, for example, an exfoliation process or a growth process.

On the graphene, e.g., graphene prepared by the exfoliation process or the growth process, the thermoelectric inorganic compound is disposed, e.g., stacked or formed, to form the heterogeneous laminate to provide the graphene-containing thermoelectric material. The thermoelectric inorganic compound may comprise any suitable thermoelectric inorganic compound. For example, the thermoelectric inorganic compound may include at least one selected from a transition metal, a rare earth element, a Group 13 element, a Group 14 element, a Group 15 element, and a Group 16 element. The rare earth element may be at least one selected from Y, Ce, and La, and the like. The transition metal may include at least one selected from Ti, Zr, Hf, V, Nb, Ta, Cr, Mo, W, Mn, Fe, Co, Ni, Cu, Zn, Ag, and Re. The Group 13 element may include at least one selected from B, Al, Ga, and In. The Group 14 element may include at least one selected from C, Si, Ge, Sn, and Pb. The Group 15 element may include at least one selected from P, As, Sb, and Bi, and the Group 16 element may include at least one selected from S, Se, and Te.

In an embodiment, a plurality of thermoelectric inorganic compounds, each independently selected and each including one or more of the elements described above, may be used.

The thermoelectric inorganic compound may include, for example, at least one selected from a Bi—Te-based compound, a Co—Sb-based compound, a Pb—Te-based compound, a Ge—Tb-based compound, a Si—Ge-based compound, Bi—Sb—Te-based compound, an Sb—Te-based compound, a Sm—Co-based compound, and a transition metal silicide-based compound. Also, the electrical characteristics of the thermoelectric inorganic compound may be improved by including, e.g., as a dopant, at least one element selected from the transition metal, the rare earth element, the Group 13 element, the Group 14 element, the Group 15 element, and the Group 16 element.

An example of the Bi—Te-based thermoelectric inorganic compound is a $(Bi,Sb)_2(Te,Se)_3$-based thermoelectric inorganic compound. In an embodiment, Sb and Se are dopants. An example of the Co—Sb-based thermoelectric inorganic compound is a $CoSb_3$-based thermoelectric inorganic compound. Examples of the Sb—Te-based thermoelectric inorganic compound are $AgSbTe_2$ and $CuSbTe_2$. Examples of the Pb—Te-based thermoelectric inorganic compound are PbTe and $(PbTe)_m AgSbTe_2$, wherein m is about 0.5 to about 2, specifically about 1.

The heterogeneous laminate may be formed by directly stacking a film of the thermoelectric inorganic compound on the graphene. Alternatively, the thermoelectric inorganic compound may be grown directly on the graphene in the form of a film. For example, the thermoelectric inorganic compound may be formed in the form of a film on the graphene by, for example, deposition, and the thermoelectric inorganic compound film may have a nanoscale thickness, e.g., a thickness of, for example, about 0.1 nanometers (nm) to about 1,000 nm, specifically about 1 nm to about 800 nm, more specifically about 10 nm to about 600 nm. Also, a planar area of the film may be about 5 to about 5000 times, specifically at least about 100 times greater than a cross-sectional area of the film. The deposition method is not limited, and may be a physical deposition method, such as evaporation or sputtering, or a chemical vapor deposition ("CVD") method, such as a metal-organic CVD method or hydride vapor epitaxy method.

The thermoelectric inorganic compound may have a polycrystalline structure or a monocrystalline structure.

A thermoelectric inorganic compound formed by deposition may grow to have an epitaxial structure on the graphene. By the epitaxial growth, the thermoelectric inorganic compound may be disposed, e.g., stacked, to have a crystallographic direction identical to or substantially aligned with a crystallographic axis of the graphene. Also, the structure of the thermoelectric inorganic compound may be in registry with the structure of the graphene. Thus, when the graphene has a polycrystalline structure, the thermoelectric inorganic compound formed thereon may also have the polycrystalline structure.

When a thermoelectric inorganic compound having a monocrystalline structure on the graphene is desired, exfoliated nanoparticles of the thermoelectric inorganic compound may be used. Alternatively, a tape exfoliation or ultrasound dispersion exfoliation process may be used to form a thermoelectric inorganic compound film having a monocrystalline structure, and then the thermoelectric inorganic compound film may be disposed, e.g., stacked, on the graphene.

When the thermoelectric inorganic compound is disposed in the form of a film on the graphene by a growth process, the thermoelectric inorganic compound, at its interface with the graphene, may have a selected orientation. Due to an interaction between a crystal structure of the graphene and the thermoelectric inorganic compound disposed thereon, the thermoelectric inorganic compound may have a crystal structure directed by the graphene, and thus, may have a selected orientation.

The crystallographic orientation of the thermoelectric inorganic compound film disposed on the graphene may be measured by X-ray diffraction ("XRD"), and from the XRD measurement results, it may be confirmed that the thermoelectric inorganic compound film has a (00l) surface (where l is an integer of 1 to 99).

Figure 1A:
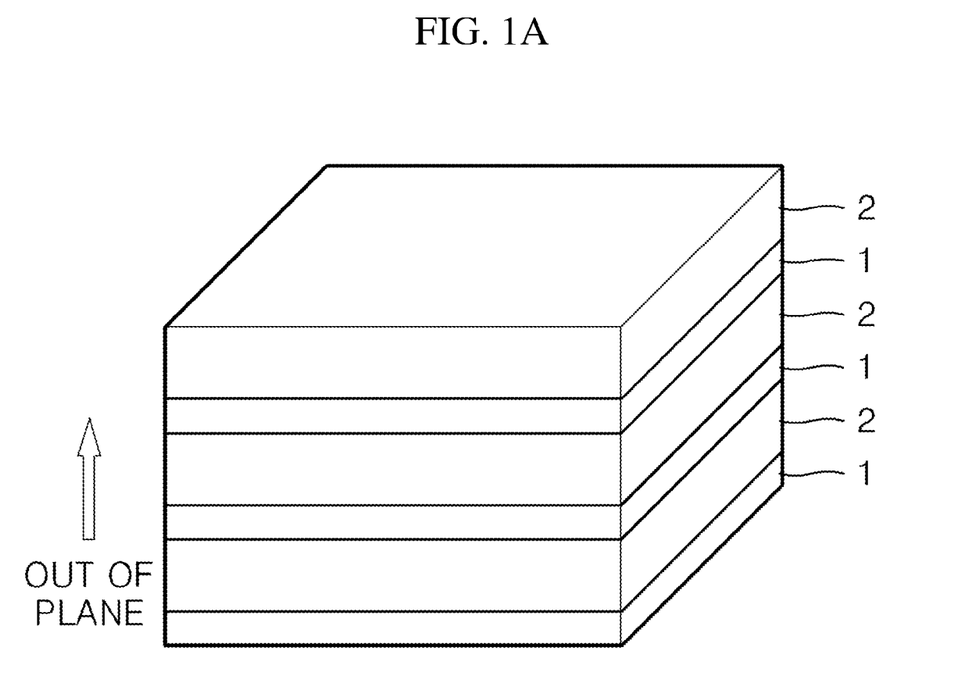
FIG. 1A is a schematic view of an embodiment of a heterogeneous laminate.

The crystallographic orientation of the (00l) surface of the thermoelectric inorganic compound film may contribute to various physical properties of the out-of-plane direction, which is illustrated in FIG. 1A. While not wanting to be bound by theory, it is understood that because the film of the thermoelectric inorganic compound disposed on the graphene has a selected orientation, crystal properties and an electron structure thereof are changed at the interface between the graphene, which has metallic properties, and the thermoelectric inorganic compound, which has semiconducting properties. Thus, the Seebeck effect is increased and transmission of charged particles is accelerated to provide an increase in electrical conductivity and charge mobility. Also, phonon scattering at the interface between the graphene and the thermoelectric inorganic compound is enhanced, thereby enabling control of, e.g., reducing, the thermal conductivity. Also, because the thermoelectric inorganic compound has a nano-scale, a quantum confinement effect may be provided, and due to the confinement of a phonon in a nano film (e.g., to provide phonon glass electron crystal ("PGEC") behavior), thermal conductivity may be reduced. According to the PGEC concept, movement of phonons that deliver heat is blocked, and movement of carriers, such as electrons or holes, is substantially not impeded, so as to selectively reduce only the thermal conductivity of a material.

While not wanting to be bound by theory, it is understood that the quantum confinement effect increases the density of states of a carrier in a material to increase an effective mass, thereby increasing the Seebeck effect while not significantly changing the electrical conductivity, breaking the interrelationship between the electrical conductivity and the Seebeck effect. The PGEC concept can be used to block the flow of phonons, which deliver heat and do not substantially prevent the flow of a carrier, thereby effectively reducing only the thermal conductivity.

As is further described above, the out-of-plane direction, which is illustrated in FIG. 1A, is a spatial concept to distinguish the in-plane direction of graphene, which has a planar structure. The out-of-plane direction can correspond to a z-axis direction, and may be perpendicular to an x-y plane (defined by x-y axes). The thermoelectric inorganic compound may be stacked in the out-of-plane direction.

Figure 1B:
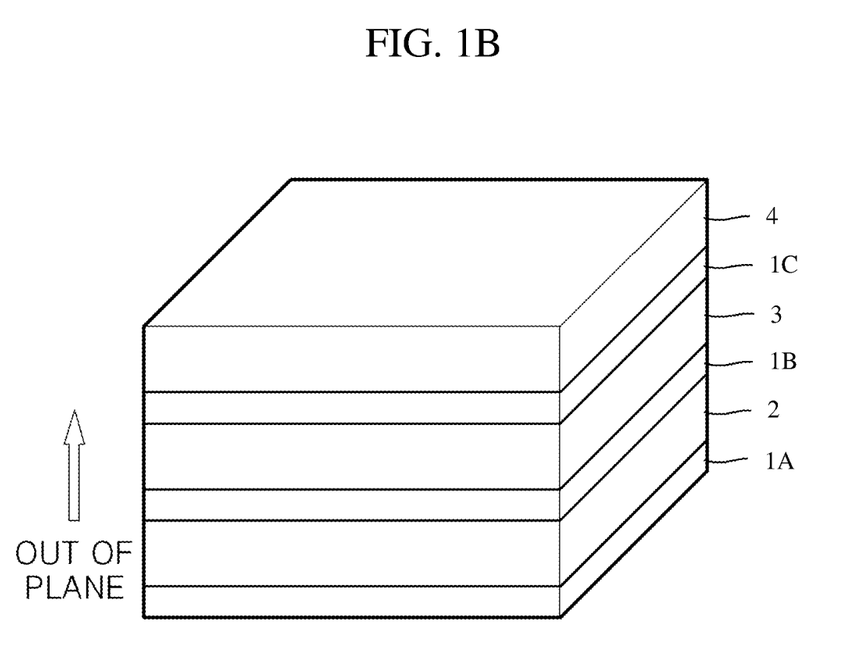
FIG. 1B is a schematic view of another embodiment of a heterogeneous laminate.

The heterogeneous laminate of the graphene and the thermoelectric inorganic compound may be obtained by stacking the thermoelectric inorganic compound on the graphene. In an embodiment, the heterogeneous laminate may have a superlattice structure. The superlattice structure is a structure formed by sequentially alternately stacking the graphene and the thermoelectric inorganic compound film. This alternate stacking may be performed to form a heterogeneous laminate including a unit cell comprising a graphene layer and a thermoelectric inorganic compound layer. The heterogeneous laminate may include any suitable number of unit cells, for example, 1 to about 100 unit cells, specifically about 2 to about 90 unit cells, each comprising graphene and the thermoelectric inorganic compound. Disclosed in FIG. 1B is an embodiment of a heterogeneous laminate comprising a plurality of layers of the graphene and the thermoelectric inorganic compound, including first, second, and third graphene layers 1A, 1B, and 1C, respectively, and first, second, and third thermoelectric inorganic compound layers 2, 3, and 4, respectively. The thermoelectric inorganic compound of each thermoelectric inorganic layer may be independently selected, and may include at least one selected from a transition metal, a rare earth element, a Group 13 element, a Group 14 element, a Group 15 element, and a Group 16 element, as is further disclosed above. In an embodiment each layer of the thermoelectric inorganic compound is the same.

In an embodiment, layers of the graphene and the thermoelectric inorganic compound may form a repeating unit which periodically repeat to form the superlattice structure. For example, in an embodiment the heterogeneous laminate may comprise a first graphene layer and a first thermoelectric inorganic compound layer, which together form a unit cell, and a plurality of unit cells may periodically repeat to form the superlattice structure. The unit cell may comprise any suitable number of layers, e.g., about 2 to about 100, specifically about 4 to about 90 layers of the graphene, and independently about 2 to about 100, specifically about 4 to about 90 layers of the thermoelectric inorganic compound. Also, the heterogeneous laminate may comprise any suitable number of unit cells, e.g., 1 to about 1000 unit cells, specifically about 2 to about 500 unit cells. Thus, for example, in an embodiment a heterogeneous laminate may comprise two unit cells having a total of 8 layers, wherein each unit cell comprises a first graphene layer, a first thermoelectric inorganic compound layer, a second graphene layer, and a second thermoelectric inorganic layer, wherein the first and second thermoelectric inorganic layers are different.

In the heterogeneous laminate of the graphene and the thermoelectric inorganic compound, a p-type or n-type material may be used as the thermoelectric inorganic compound, and independently the graphene may be doped with a p-dopant or n-dopant.

The heterogeneous laminate of the graphene and the thermoelectric inorganic compound may have various sizes and thickness. For example, the size, i.e., planar area, of the heterogeneous laminate may be 1 square millimeter ($mm^2$) to 1 square meter ($m^2$) or more, specifically 1 $mm^2$ to 1 square centimeter ($cm^2$), and may be as large as 1 millimeter ($mm$)×1 mm, or 1 centimeter ($cm$)×1 cm, or more.

As described above, the heterogeneous laminate of the graphene and the thermoelectric inorganic compound has thermoelectric performance which is better than the thermoelectric inorganic compound alone. Thus, the heterogeneous laminate may be usefully applied to provide a thermoelectric element, a thermoelectric module, or a thermoelectric apparatus.

An example of a method of preparing the heterogeneous laminate of the graphene and the thermoelectric inorganic compound is described in further detail below.

First, graphene is formed on a substrate, and a film of the thermoelectric inorganic compound is formed thereon to form the heterogeneous laminate of the graphene and the thermoelectric inorganic compound.

In the forming of the graphene on the substrate, graphene that is obtained by a growth process or an exfoliation process may be used, the details of which may be determined by one of skill in the art without undue experimentation. For example, graphene having a monocrystalline or polycrystalline structure, or epitaxially grown graphene may be used. Graphene may have, for example, one to about 300 layers, specifically 2 to about 200 layers.

In an exfoliation process, as an example of the method of preparing the graphene, graphene is separated using a mechanical means (for example, scotch tape) or an oxidation-reduction process from a material that comprises graphene therein. An example of such a material is graphite or a highly oriented pyrolytic graphite ("HOPG").

In an example of a growth process of preparing the graphene, carbon included in or adsorbed on an inorganic material, for example, silicon carbide, is grown on the surface of the inorganic material at a high temperature. Alternatively, a carbon source, for example, methane or ethane, is dissolved in or adsorbed on a catalyst layer, for example, a nickel or copper film, followed by cooling to crystallize carbon on the surface of the catalyst layer to form graphene. Graphene formed by this method may have a planar area of 1 square centimeter ($cm^2$) or more, e.g., about 0.1 $cm^2$ to about 1 square meter ($m^2$), and the shape thereof may be independently selected. Also, the number of layers that constitute the graphene may be selected by selection of a substrate, a catalyst, a thickness of the catalyst, a reaction time, a cooling rate, and a concentration of a reaction gas. As a result, graphene formed using a growth process may have excellent reproducibility and may have a large size. The growth process may be any suitable method used in the art.

The substrate on which the graphene is disposed, e.g., formed, may comprise at least one selected from an inorganic substrate, including at least one selected from a Si substrate, a glass substrate, a GaN substrate, and a silica substrate; and a metal substrate including at least one selected from Ni, Co, Fe, Pt, Pd, Au, Al, Cr, Cu, Mn, Mo, Rh, Ir, Ta, Ti, W, U, V and Zr; and the like.

After graphene is formed on a substrate as described above, a film of the thermoelectric inorganic compound may be disposed, e.g., stacked on the graphene. As explained above, the film of the thermoelectric inorganic compound may be formed by exfoliating a film from a particulate thermoelectric inorganic compound, or by directly growing a thermoelectric inorganic compound film on the graphene, for example.

When a film of the thermoelectric inorganic compound is formed on graphene by deposition, the thickness and/or crystal structure of the formed film of the thermoelectric inorganic compound may be selected by appropriately selecting deposition conditions. When provided by epitaxial growth, the thermoelectric inorganic compound may be disposed to have a crystallographic direction identical to or substantially aligned with a crystallographic axis of the graphene, and the thermoelectric inorganic compound may be in registry with the graphene.

The heterogeneous laminate comprising graphene and the thermoelectric inorganic compound provides improved thermoelectric performance and may be suitable for use as a thermoelectric material. A thermoelectric element may be manufactured by molding, or for example, cutting the thermoelectric material including the heterogeneous laminate of graphene and the thermoelectric inorganic compound. The thermoelectric element may be a p-type or an n-type thermoelectric element. The thermoelectric element refers to a structure which may be formed by forming the thermoelectric material into a selected shape, for example, a rectangular shape.

Also, the thermoelectric element may be connected to an electrode, and when a current is provided, a cooling effect may occur. Also, the thermoelectric element may be a component that generates power due to a temperature difference.

Figure 2:
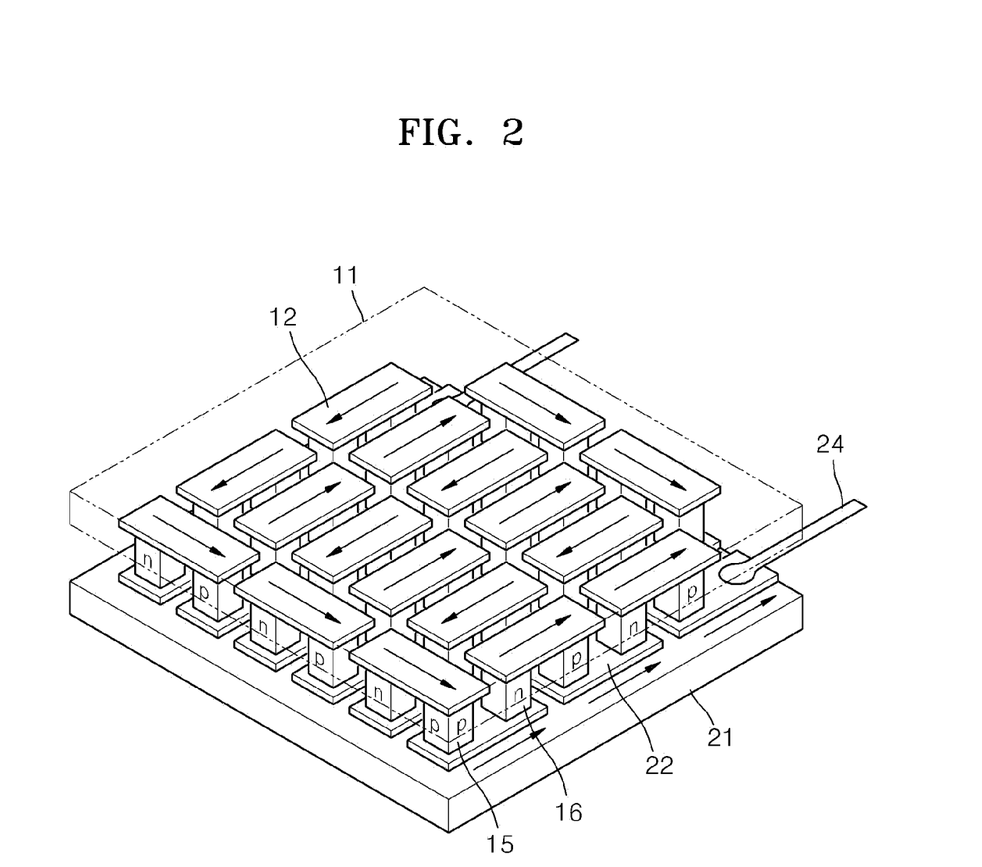
FIG. 2 is a schematic view of an embodiment of a thermoelectric module.

FIG. 2 is a schematic view of an embodiment of a thermoelectric module including the thermoelectric element, according to an exemplary embodiment. Referring to FIG. 2, a top electrode 12 and a bottom electrode 22 are disposed, e.g., patterned, on a top insulating substrate 11 and a bottom insulating substrate 21, respectively, and the top electrode 12 and the bottom electrode 22 contact a p-type thermoelectric element 15 and an n-type thermoelectric element 16. The top electrode 12 and the bottom electrode 22 are connected to the outside of the thermoelectric element by a lead electrode 24.

The top and bottom insulating substrates 11 and 21 may include at least one selected from gallium arsenic (GaAs), sapphire, silicon, Pyrex®, and quartz. The top and bottom electrodes 12 and 22 may include at least one selected from copper, aluminum, nickel, gold, and titanium, and a size thereof may be independently selected. The patterning method for the top and bottom electrodes 12 and 22 may be any one of various patterning methods known in the art, and may be, for example, a lift-off semiconductor process, a deposition method, or a photolithography method.

Figure 3:
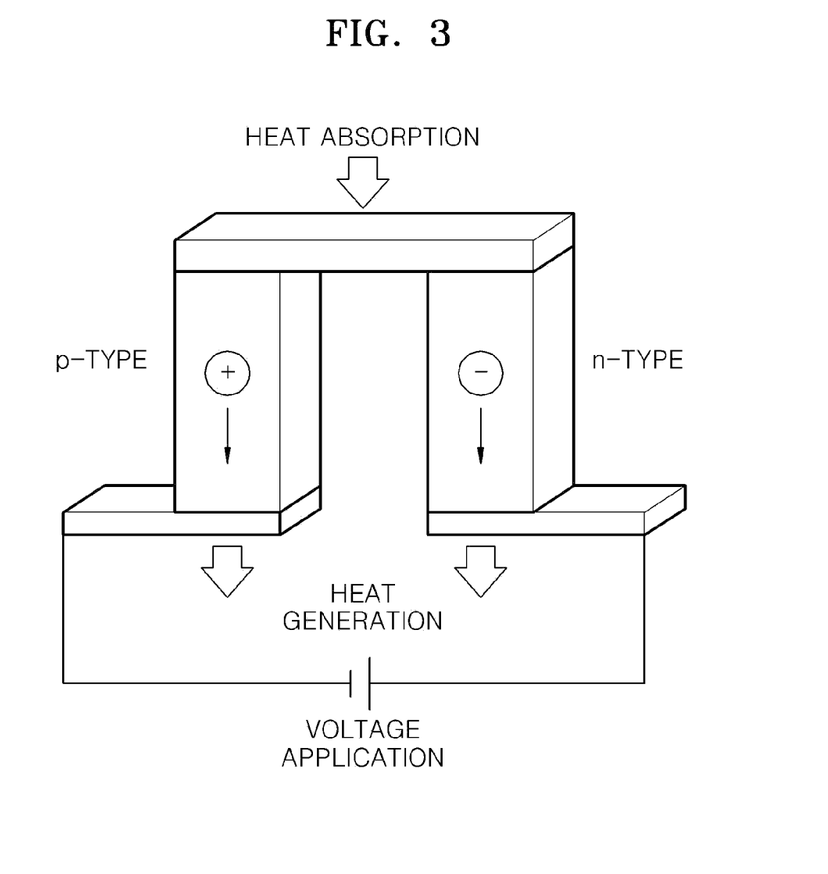
FIG. 3 is a schematic view illustrating an embodiment of thermoelectric cooling by the Peltier effect.
Figure 4:
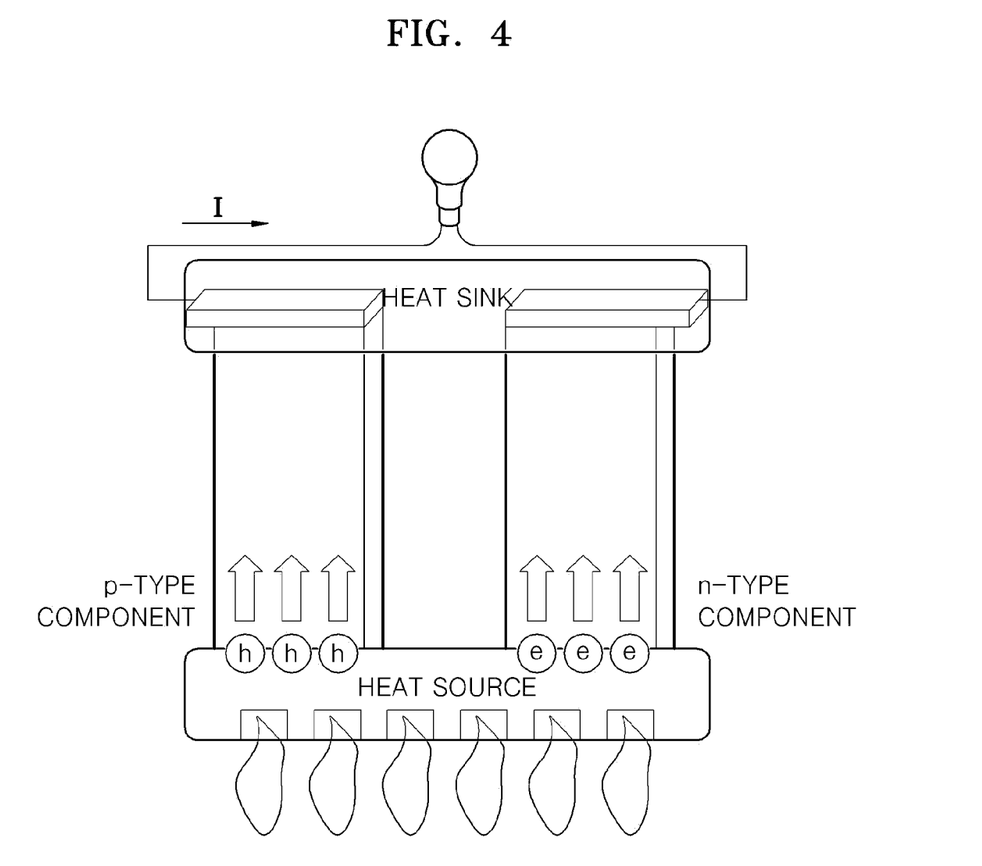
FIG. 4 is a schematic view illustrating an embodiment of thermoelectric power generation by the Seebeck effect.

According to an exemplary embodiment, in the thermoelectric module, as illustrated in FIGS. 3 and 4, a first electrode or a second electrode may be exposed to a heat source, may be electrically connected to a power source, or may be electrically connected to the outside of the thermoelectric module, for example, an electric device that consumes or stores power (for example, a battery).

Hereinafter, an embodiment will be described in further detail with reference to examples. The scope of this disclosure shall not limited thereto.

Example 1

A single-layer of graphene having a size of 1 centimeter (cm)×1 cm obtained by atmospheric pressure CVD is transferred on an oxidized high-resistance p-doped Si wafer having a size of 1.2 cm×1.2 cm and including a 300 nanometers (nm) $SiO_2$ layer.

The single-layer of graphene is grown on a Cu foil (purity of 99.9%, thickness of 75 micrometers (μm) at a temperature of 1,060° C. using 5 Standard Cubic Centimeters per Minute (SCCM) of $CH_4$ gas, 10 SCCM of $H_2$ gas, and 1,000 SCCM of Ar gas. The grown graphene is transferred on a $Si/SiO_2$ (500 μm/300 nm) substrate using poly(methyl methacrylate) ("PMMA") (MicroChem, e-beam resist, 950 k C4).

$Sb_2Te_3$ as a thermoelectric inorganic compound is formed to a thickness of 10 nm on the graphene by sputtering. During the sputtering, the wafer rotational rate is 50 revolutions per minute (RPM), the wafer temperature is 200° C., pressure was maintained at 3 millitorr (mTorr), and Ar plasma is used. As a target material, $Sb_2Te_3$ alloy is used, and 30 watts (W) of power is used.

Before the sputtering, a portion of the graphene is masked with a polyamide film and polytetrafluoroethylene ("PTFE") so that the thermoelectric inorganic compound is not deposited on the masked portion of the graphene.

Comparative Example 1

$Sb_2Te_3$ as a thermoelectric inorganic compound is formed to a thickness of 10 nm on an oxidized high-resistance p-doped Si wafer having a size of 1.2 cm×1.2 cm and including a 300 nm $SiO_2$ layer by sputtering. During the sputtering, the wafer rotational rate is 50 RPM, the wafer temperature was 200° C., pressure is maintained at 3 mTorr, and Ar plasma is used. As a target material, $Sb_2Te_3$ alloy is used, and 30 W of power was used.

Before the sputtering, a portion of the wafer is masked with a polyamide film and PTFE so that the thermoelectric inorganic compound is not deposited on the masked portion of the graphene.

Experimental Example 1

XRD Measurement

X-ray diffraction ("XRD") analysis is performed on the heterogeneous laminate prepared according to Example 1, and it is confirmed that the heterogeneous laminate had (006), (009), (0015), and (0018) crystal surfaces. From these results, it is confirmed that the heterogeneous laminate has an orientation in an out-of-plane direction (i.e., a direction perpendicular to the laminate).

Experimental Example 2

Electrical Conductivity Measurement (in an in-Plane Direction and in an Out-of-Plane Direction)

Figure 5:
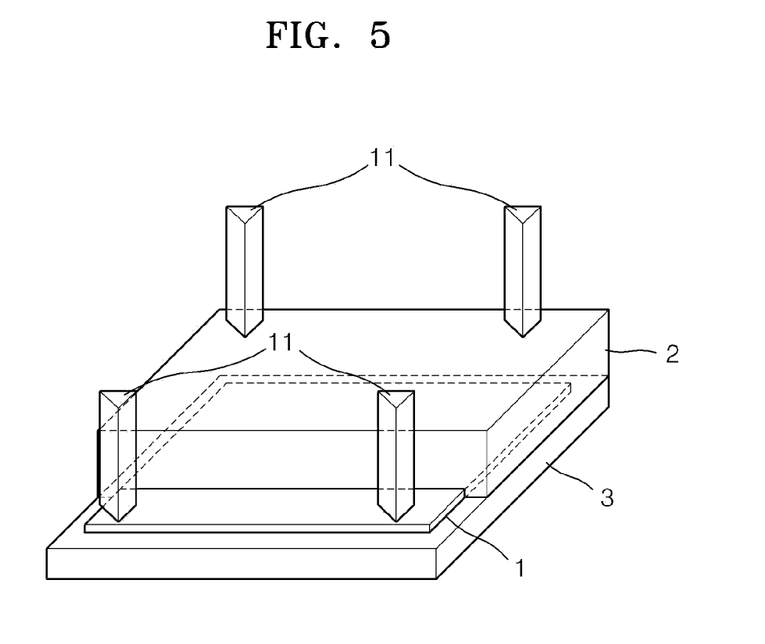
FIG. 5 is a perspective view illustrating a 4-terminal measurement method applied to a heterogeneous laminate.

Electrical conductivities of the heterogeneous laminates prepared according to Example 1 and Comparative Example 1 are measured according to the van der Pauw as illustrated in FIG. 5. Referring to FIG. 5, a graphene 1 and a thermoelectric inorganic compound film 2 are stacked on a Si/SiO$_2$ substrate 3, and a portion of the graphene 1 is exposed. Four probes 11 are installed on the exposed portion of the graphene 1 and the thermoelectric inorganic compound film 2 to measure electrical conductivity.

With this measurement method, the combined electrical conductivities of the in-plane direction (basal plane) and the out-of-plane direction are measured. The results are shown in Table 1

Experimental Example 3

Electrical Conductivity Measurement (in-Plane Direction)

Electrical conductivity is measured in the same manner as in Experimental Example 2, except that the four probes 11 are all located on top of the thermoelectric inorganic compound film 2.

With this measurement method, the electrical conductivity in the in-plane direction (basal plane) is measured.

Experimental Example 4

Seebeck Effect Measurement (in the in-Plane Direction and in the Out-of-Plane Direction)

The Seebeck effect of the heterogeneous laminate prepared according to Example 1 and Comparative Example 1 is measured according to van der Pauw illustrated in FIG. 5.

Referring to FIG. 5, the graphene 1 and the thermoelectric inorganic compound film 2 are stacked on the Si/SiO$_2$ substrate 3, and the portion of the graphene 1 is exposed. The four probes 11 are installed on the exposed portion of the graphene 1 and the thermoelectric inorganic compound film 2 to measure the Seebeck effect.

When this measurement method is used, the combined Seebeck effects of the in-plane direction (basal plane) and the out-of-plane direction are measured.

Experimental Example 5

Seebeck Effect Measurement (in-Plane Direction)

The Seebeck effect is measured in the same manner as in Experimental Example 4, except that the four probes 11 are all located on top of the thermoelectric inorganic compound film 2.

When this measurement method is used, the Seebeck effect in the in-plane direction (basal plane) is measured. The results are shown in Table 1 below

TABLE 1

|  | Example 1 (in-plane) | Example 1 (in-plane and out-of-plane) | Comparative Example 1 |
|---|---|---|---|
| Electrical conductivity (S/m) | 848 | 1480 | 439 |
| Seebeck effect (µV/K) | 330 | 416.93 | 222.09 |
| Power factor (W/K$^2$cm) | $9.5 \times 10^{-5}$ | $2.57 \times 10^{-4}$ | $2.16 \times 10^{-5}$ |

S/m is Siemens per meter;
µV/K is microvolts per Kelvin,
W/K$^2$cm is watts per Kelvin$^2$-centimeters.

As shown in Table 1, the heterogeneous laminate of graphene and the thermoelectric inorganic compound prepared according to Example 1 has increased in-plane electrical conductivity, Seebeck effect, and power factor compared to the thermoelectric inorganic compound of Comparative Example 1. When the in-plane direction and the out-of-plane direction were measured together, the electrical conductivity, the Seebeck effect, and the power factor were increased more than when only the in-plane direction is present.

As described above, the thermoelectric material according to the disclosed embodiment has increased Seebeck effect and electrical conductivity and thus has improved thermoelectric conversion efficiency. The thermoelectric material may be used to provide a thermoelectric element, a thermoelectric module, or a thermoelectric apparatus, and may be usefully applied in a cooling device, such as a refrigerant-free refrigerator or an air conditioner, or for a waste heat generation, thermoelectric nuclear generation, e.g., for aircraft or space purposes, or for a micro cooling system.

It shall be understood that the exemplary embodiment described herein shall be considered in a descriptive sense only and not for purposes of limitation. Descriptions of features, advantages, or aspects within each embodiment shall be considered as available for other similar features, advantages, or aspects in other embodiments.

What is claimed is:

1. A heterogeneous laminate comprising:
   graphene; and
   a thermoelectric inorganic compound disposed on the graphene, wherein the thermoelectric inorganic compound comprises at least one compound selected from a compound comprising Bi and Te, a compound comprising Co and Sb, a compound comprising Pb and Te, a compound comprising Ge and Tb, a compound comprising Bi, Sb, and Te, a compound comprising Sb and Te, a compound comprising Sm and Co, and a compound comprising a transition metal and silicon, and
   wherein the heterogeneous laminate comprises a plurality of alternating layers of the graphene and the thermoelectric inorganic compound which are stacked on each other.

2. The heterogeneous laminate of claim 1, wherein the graphene comprises about 2 to about 100 layers.

3. The heterogeneous laminate of claim 1, wherein the graphene has a randomly stacked structure.

4. The heterogeneous laminate of claim 1, wherein the plurality of alternating layers of the graphene and the thermoelectric inorganic compound comprises a first thermoelectric layer comprising a first thermoelectric inorganic compound and a second thermoelectric layer comprising a second thermoelectric inorganic compound, wherein the first and second thermoelectric inorganic compounds are different.

5. The heterogeneous laminate of claim 1, wherein the plurality of alternating layers of the graphene and the thermoelectric inorganic compound comprises about 2 to about 100 layers of graphene and about 2 to about 100 layers of the thermoelectric inorganic compound.

6. The heterogeneous laminate of claim 1, wherein the heterogeneous laminate has a superlattice structure.

7. The heterogeneous laminate of claim 6, wherein each unit cell of the superlattice structure comprises a plurality of alternating layers of the graphene and the thermoelectric inorganic compound.

8. The heterogeneous laminate of claim 1, wherein the thermoelectric inorganic compound is a p-type semiconductor.

9. The heterogeneous laminate of claim 1, wherein the thermoelectric inorganic compound is in the form of a film.

10. The heterogeneous laminate of claim 9, wherein the film has a planar area which is at least about 100 times greater than a cross-sectional area.

11. The heterogeneous laminate of claim 9, wherein the film has a thickness of about 0.1 nanometer to about 1,000 nanometers.

12. The heterogeneous laminate of claim 1, wherein the thermoelectric inorganic compound has a polycrystalline structure.

13. The heterogeneous laminate of claim 1, wherein the thermoelectric inorganic compound has a monocrystalline structure.

14. The heterogeneous laminate of claim 1, wherein a crystallographic orientation of the thermoelectric inorganic compound corresponds to a crystallographic orientation of the graphene.

15. The heterogeneous laminate of claim 1, wherein the thermoelectric inorganic compound is in epitaxy with the graphene.

16. The heterogeneous laminate of claim 1, wherein the thermoelectric inorganic compound has a (00l) surface wherein l is an integer of 1 to 99.

17. The heterogeneous laminate of claim 1, wherein the thermoelectric inorganic compound has a crystallographic orientation which is aligned with an out-of-plane direction of the graphene.

18. The heterogeneous laminate of claim 1, wherein the thermoelectric inorganic compound comprises at least one selected from a Bi—Te compound, a Co—Sb compound, a Pb—Te compound, a Ge—Tb compound, a Bi—Sb—Te compound, an Sb—Te compound, and an Sm—Co compound.

19. A thermoelectric module comprising:
a first electrode;
a second electrode; and
a thermoelectric element interposed between the first electrode and the second electrode, wherein the thermoelectric element comprises a heterogeneous laminate comprising graphene and a thermoelectric inorganic compound disposed on the graphene, wherein the thermoelectric inorganic compound comprises at least one compound selected from a compound comprising Bi and Te, a compound comprising Co and Sb, a compound comprising Pb and Te, a compound comprising Ge and Tb, a compound comprising Bi, Sb, and Te, a compound comprising Sb and Te, a compound comprising Sm and Co, and a compound comprising a transition metal and silicon, and
wherein the heterogeneous laminate comprises a plurality of alternating layers of the graphene and the thermoelectric inorganic compound which are stacked on each other.

20. A thermoelectric apparatus comprising:
a heat source; and
a thermoelectric module comprising
a first electrode
a second electrode; and
a thermoelectric element interposed between the first and second electrodes,
wherein the thermoelectric element comprises a heterogeneous laminate comprising graphene and a thermoelectric inorganic compound disposed on the graphene, wherein the thermoelectric inorganic compound comprises at least one compound selected from a compound comprising Bi and Te, a compound comprising Co and Sb, a compound comprising Pb and Te, a compound comprising Ge and Tb, a compound comprising Bi, Sb, and Te, a compound comprising Sb and Te, a compound comprising Sm and Co, and a compound comprising a transition metal and silicon, and
wherein the heterogeneous laminate comprises a plurality of alternating layers of the graphene and the thermoelectric inorganic compound which are stacked on each other.

21. A method of manufacturing a heterogeneous laminate, the method comprising:
disposing graphene on a substrate; and
disposing a thermoelectric inorganic compound on the graphene to manufacture the heterogeneous laminate, wherein the heterogeneous laminate comprises
graphene, and
a thermoelectric inorganic compound disposed on the graphene, wherein the thermoelectric inorganic compound comprises at least one compound selected from a compound comprising Bi and Te, a compound comprising Co and Sb, a compound comprising Pb and Te, a compound comprising Ge and Tb, a compound comprising Bi, Sb, and Te, a compound comprising Sb and Te, a compound comprising Sm and Co, and a compound comprising a transition metal and silicon, and
wherein the heterogeneous laminate comprises a plurality of alternating layers of the graphene and the thermoelectric inorganic compound which are stacked on each other.

22. The method of claim 21, wherein the disposing the graphene comprises forming the graphene on the substrate.

23. The method of claim 21, wherein the disposing of the graphene comprises forming the graphene on a surface, exfoliating the graphene from the surface, and depositing the exfoliated graphene on the substrate.

24. The method of claim 21, wherein the disposing of the thermoelectric inorganic compound comprises epitaxially growing the thermoelectric inorganic compound on the graphene.

25. The method of claim 21, wherein the disposing of the thermoelectric inorganic compound comprises forming the thermoelectric inorganic compound on a surface, exfoliating the thermoelectric inorganic compound from the surface, and depositing the exfoliated thermoelectric inorganic compound on the graphene.

26. The method of claim 21, wherein the graphene has a randomly stacked structure.

27. The method of claim 21, wherein the heterogeneous laminate comprises a plurality of alternating layers of the graphene and the thermoelectric inorganic compound.

28. A method of manufacturing a thermoelectric module, the method comprising:
interposing a thermoelectric element between a first electrode and a second electrode to manufacture the thermoelectric module, the thermoelectric element comprising a heterogeneous laminate comprising graphene and a thermoelectric inorganic compound disposed on the graphene,
wherein the thermoelectric inorganic compound comprises at least one compound selected from a compound comprising Bi and Te, a compound comprising Co and Sb, a compound comprising Pb and Te, a compound comprising Ge and Tb, a compound comprising Bi, Sb, and Te, a compound comprising Sb and Te, a compound comprising Sm and Co, and a compound comprising a transition metal and silicon, and wherein the heterogeneous laminate comprises a plurality of alternating layers of the graphene and the thermoelectric inorganic compound which are stacked on each other.

* * * * *